(12) United States Patent
Meijer et al.

(10) Patent No.: US 7,183,043 B2
(45) Date of Patent: Feb. 27, 2007

(54) SHADOW MASK AND METHOD FOR PRODUCING A SHADOW MASK

(75) Inventors: Jan Meijer, Bochum (DE); Andreas Stephan, Bochum (DE); Ulf Weidenmuller, Bochum (DE); Ivo Rangelow, Baunatal (DE)

(73) Assignee: Universitat Kassel, Kassel (DE)

(*) Notice: Subject to any disclaimer, the term of this patent is extended or adjusted under 35 U.S.C. 154(b) by 44 days.

(21) Appl. No.: 10/344,710

(22) PCT Filed: Aug. 14, 2001

(86) PCT No.: PCT/EP01/09405

§ 371 (c)(1),
(2), (4) Date: Oct. 10, 2003

(87) PCT Pub. No.: WO02/14951

PCT Pub. Date: Feb. 21, 2002

(65) Prior Publication Data

US 2004/0219465 A1    Nov. 4, 2004

(30) Foreign Application Priority Data

Aug. 14, 2000  (DE) ................... 100 39 644

(51) Int. Cl.
*G03F 1/00* (2006.01)
*G03C 5/00* (2006.01)

(52) U.S. Cl. .................. 430/322; 430/311; 430/312; 430/313; 430/7

(58) Field of Classification Search ............ 430/322, 430/311, 312, 313
See application file for complete search history.

(56) References Cited

U.S. PATENT DOCUMENTS

| 4,342,817 A | 8/1982 | Bohlen et al. ............ 430/5 |
| 4,448,865 A | 5/1984 | Bohlen et al. ............ 430/5 |
| 5,296,125 A * | 3/1994 | Glass et al. ............ 430/311 |
| 5,500,312 A | 3/1996 | Harriott et al. ............ 430/5 |
| 5,770,336 A | 6/1998 | Choi ............ 430/5 |

FOREIGN PATENT DOCUMENTS

| DE | 197 08 766 A1 | 2/1998 |
| EP | 0 078 336 | 10/1981 |
| EP | 0 019 779 B1 | 10/1983 |
| JP | 63-252341 A | 2/1989 |
| JP | 07-140643 A | 6/1995 |
| JP | 07-152150 A | 6/1995 |
| JP | 07-283113 A | 10/1995 |
| JP | 08-240903 A | 9/1996 |
| WO | WO 92/16822 A2 | 10/1992 |
| WO | WO 92/16822 A3 | 10/1992 |

OTHER PUBLICATIONS

J. Riordon et al., "Stencil mask temperature measurement and control during ion irradiatior", *J. Vac. Sci. Technol. B.*, vol. 14, No. 6, pp. 3900-3902, Nov./Dec. 1996.
A. Ehrmann et al., "Stencil mask technology for ion beam lithography", *SPIE*, vol. 3546, pp. 194-205, Sep. 1998.
"Conducting layers for charged particle beam projection lithography masks", *IBM Research Disclosure*, vol. 2244, p. 2004, Jan. 11, 2000 (XP-001009381).
Translation of German Search Report relating to German Patent Application No. 100 39 645.3 dated Nov. 27, 2001.
German Search Report relating to German Patent Application No. 100 39 645.3 dated Nov. 27, 2001.
Declaration of Translation and Translation of the Annex to the International Preliminary Examination Report dated Dec. 11, 2002 in the PCT application for PCT/E01/09405.
Internatinaler Vorläufiger Prüfungsbericht dated Dec. 11, 2002 in the PCT application for PCT/E01/09405.

* cited by examiner

*Primary Examiner*—Geraldine Letscher
(74) *Attorney, Agent, or Firm*—Sierra Patent Group, Ltd.

(57) ABSTRACT

The disclosed device is directed towards a shadow mask for ion beams comprising a silicon wafer with a hole pattern arranged therein, wherein the silicon wafer is provided at a side confronting the incident ion beams with a metallic coating which stops the ion beams and dissipates heat, wherein an apertured region of the silicon wafer has a thickness from about 20 μm to about 200 μm and apertures in the shadow mask have lateral dimensions from about 0.5 μm to about 3 μm.

15 Claims, 5 Drawing Sheets

SHADOW MASK AND METHOD FOR PRODUCING A SHADOW MASK

Figure 1A:
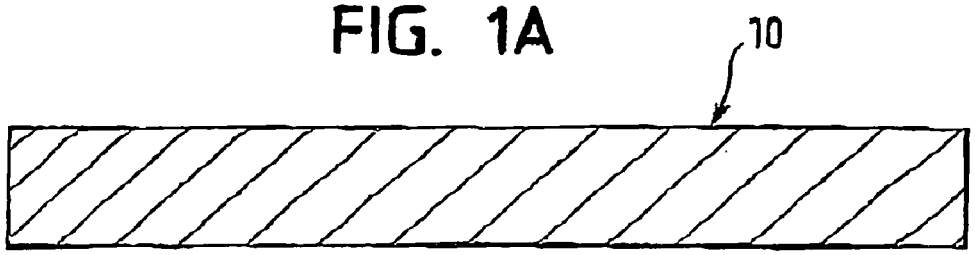

The present invention relates to a shadow mask, in particular to a shadow mask for ion beams or ionized molecular beams, comprising a silicon wafer with a hole pattern arranged therein, the invention furthermore relates to a method for the manufacture of such a shadow mask.

Shadow masks of the initially named kind and also methods for their manufacture and certain applications of the same are known from U.S. Pat. No. 5,672,449. The silicon wafers there are relatively thin with thicknesses below 10 μm which are for example used for lithographic purposes. The ion beams which are used here have very small powers, for example up to about 10 Milliwatts.

It is also known to carry out a structuring of a substrate by means of ion. beams by the application of a contact mask. The customary structuring through the application of a contact mask on a substrate however fails if the substrate is strongly heated during the implantation or if the introduced ion doses are very high. Ion beams with large penetration depths can also not be structured in this manner in the sub-micrometer range. One known solution of this problem is to separate the mask and the substrate. This takes place for example by the ion projection in that the ion beams are guided through a diaphragm or shadow mask and are imaged onto a substrate by means of a suitable lens. Examples of these methods are the patents no. DE 19633320 A1 and DE 2702445 A1. In both methods the previous mask technology is however not suitable for blending out ion beams of high power density. The previous ion projection methods (patent no. DE 19633320 A1) are thus restricted to ion beams of low power density. These masks are destroyed in a short time by ion beams of high power density.

The present invention relates, in contrast, to shadow masks, methods of using shadow masks and applications of shadow masks which can be used with particle beams of all kinds, for example ions with comparatively high power densities in the order of magnitude of some watts/cm_ or more in order to structure substrates of the most diverse kind rapidly under high doses and with sharp edges and in order to implant ions into substrates.

The sharp-edged structuring of substrates signifies here for example the ability to produce structures with a resolution smaller than 3 μm on an area larger than 1 mm_.

The object of the present invention is to present such shadow masks and also methods for their manufacture and uses which are suitable for use with particle beams and ion beams with relatively high power densities, for example in order to blend out ion beams with power densities in the above-mentioned order of magnitude and nevertheless to attain a durability of the shadow masks of more than 100 operating hours.

In order to satisfy this object provision is made, in accordance with the invention, that the silicon disk has, at the side confronting the incident ion beams, a metal coating which stops the ion beams and dissipates heat. Through this metal coating the ions are, on the one hand, stopped in an effective manner and the kinetic energy of the ion beams is converted into heat, with the metallic coating, ensuring, as a result of its thermal conductivity, the required thermal dissipation.

Should the thermal dissipation not suffice in order to ensure the desired long life of the shadow mask then, in accordance with the invention, a diamond layer can be inserted between the metal coating and the silicon wafer and the thickness of this layer can for example lie between 2 μm and 10 μm. Diamond has, namely, an excellent thermal conductivity. Another possibility, which can optionally also be used in combination with the diamond layer, lies in working cooling passages into the silicon wafer and/or into the diamond layer and/or into the metal of coating, with the cooling passages being used to conduct a cooling fluid, in particular a cooling gas, for example helium, and correspondingly having to be covered over, for example by the metal coating, so that closed cooling passages are present. The cooling passages must however be provided with an inlet and an outlet which enable the supply and discharge of the fluid or gas used for the cooling. Even if the inlet and the outlet are likewise closed during the closing of the passages they can be straightforwardly freed again by spark erosion, or by other methods, so that the required connections can be applied there. The inlets and the outlets can be arranged at the front side of the shadow mask (i.e. at the side where the ions are incident), at the rear side or at the side edge of the apertured wafer.

The cooling passages can for example have a width in the range between 100 nm and 10 μm and a depth of up to 80% of the total thickness of the shadow mask. It is particularly favourable when using cooling passages that these can be matched in their distribution, density, width and depth to the local heat generation. I.e. in regions of the shadow mask with a smaller hole cross-sectional area per unit of surface area, and thus a larger heat generation as a result of the ion beams that are stopped, more heat can be dissipated by corresponding design of the cooling passages, so that a uniform temperature or a desired or also a merely acceptable temperature distribution can be achieved over the total area of the shadow mask.

The invention further comprises a method for the manufacture of sharp edged structures by particle beams of high power densities >1 W/cm_. In this way a rapid implantation and modification of smaller structures or the implantation of higher doses is possible.

In this connection a shadow mask is used with a diameter >1 mm_ which satisfies the above-named requirement with respect to stability, material, removal and thermal transport. The shadow mask can be structured in any desired manner and has a lateral resolution <3 μm. In conjunction with an image forming system structures of the mask can be transferred in reduced size onto a substrate, with the mask and the substrate being spatially separated. Through this apparatus a contamination of the substrate with mask material is prevented.

Substrates having surfaces of any desired shape can be implanted.

The substrate, with a surface of any desired shape, can be heated to high temperatures during the implantation, in order, for example, to avoid crystal damage. The applications which result from this are for example sensors on tips with a high lateral resolution or miniature pressure stamps with structures below one micrometer for the marking of any desired articles in a manner secure against forgery.

The invention thus relates to a method of structuring substrates with particle beams, for example ions, of high power density rapidly and with high doses in a sharp edged manner, with a shadow mask being used having structures with smaller than 3 μm resolution on an area >1 mm_.

The shadow mask is suitable for blending out ion beams with power densities of >3 W/cm_ and has a durability of more than 100 hours.

The maximum energy density results from the multiplication of the ion energy and the ion current density with which the mask is irradiated at any desired point in time.

This invention thus permits both high beam current densities and also ion beams of high energy to be blended out.

The form of the ion beam striking the sample is defined at the mask by the stopping of any associated regions of the ion beam in the mask material located in the beam path. The ion beam can pass unhindered through the open regions of the mask, i.e. is not scattered. In order to achieve good image forming characteristics the ion beam must radiate through the mask in approximately parallel manner. The edges of the mask structures must have very small negative edge inclinations to avoid scattering, i.e. the deflection of the ions from their flight path by collision processes with particles of the mask or transparent zones, i.e. regions of the mask in which the ions loose energy and are deflected but can still strike the sample. The side of the mask confronting the incident ion beam stops the ions during the period of durability without being destroyed during this time by the incidence of the ions or by the stopped ions. The energy introduced during stopping of the ions is led away through the mask material to a heat sink or cooling system. The thermal dissipation is so designed that a change in temperature of the mask does not impair the resolution of the image formation.

If the mask is additionally transferred by particle radiation by means of a lens onto a substrate then the structures can be projected to be smaller or larger by the factor set by the image formation.

The structural resolution achievable in this apparatus results from the structural sizes of the mask divided by the amount of the reduction or amplification V. The edge sharpness which can be achieved is restricted by the thermal expansion of the mask during the radiation divided by V and by the image forming error.

The advantage of such an apparatus is that the substrate and the mask can be spatially separated from one another, in dependence on the image formation, and contamination can be avoided by mask material removed by the ion beam. The substrate can be heated during the implantation to high temperatures without destroying the mask. Furthermore high doses and ions of high penetration depth can be implanted in structured manner into a substrate which would not be possible with customary contact masking.

The provision of masks in accordance with the invention and having these characteristics opens up the possibility of manufacturing novel materials by structured implantation and of structuring materials under conditions which would prohibit an otherwise customary contact masking.

The invention will be explained in more detail in the following with reference to embodiments and to the accompanying drawing in which are shown.

Figure 2A:
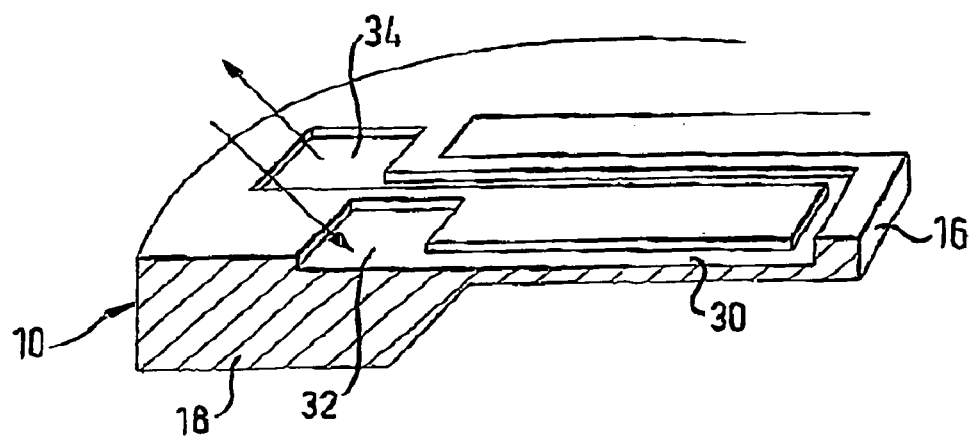
Figure 2B:
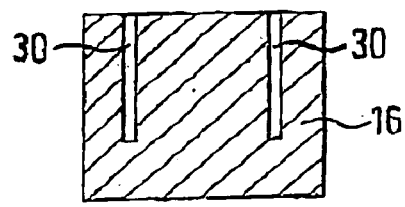
Figure 2C:
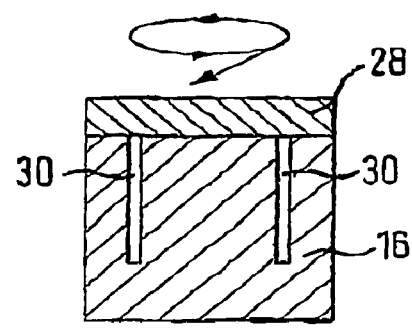
Figure 3:
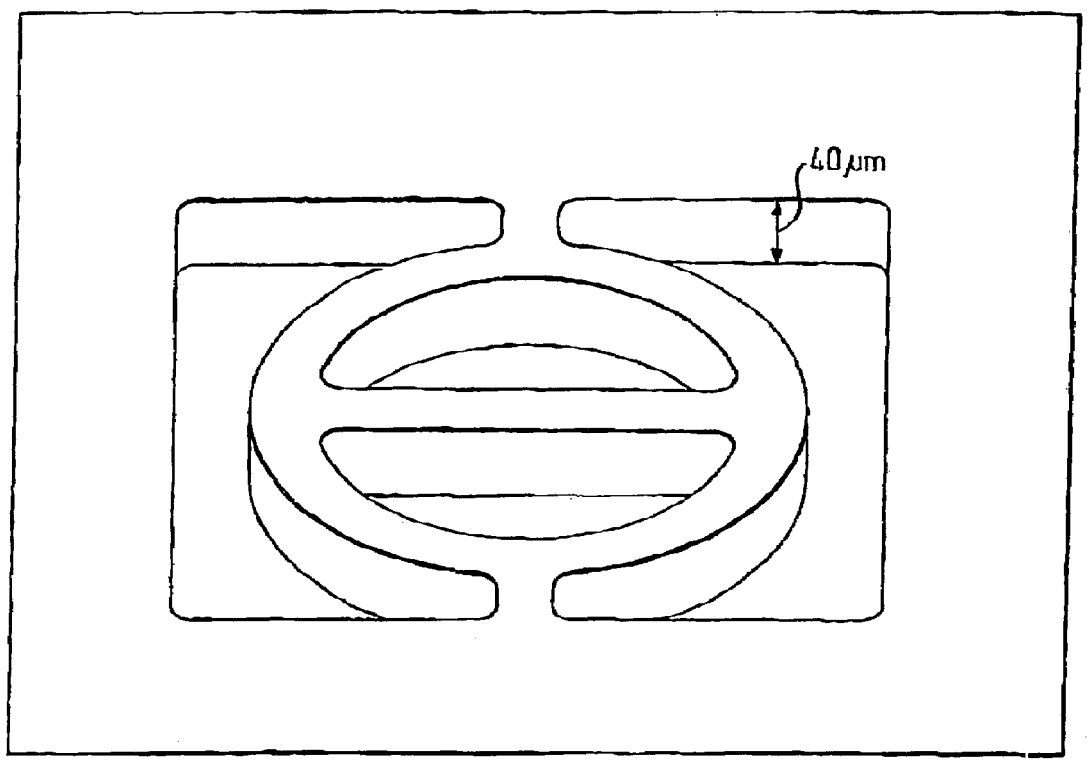

FIGS. 1A–1K an embodiment of the method of the invention by way of example,

FIGS. 2A–2C a schematic representation of an embodiment for a mask in accordance with the invention with integrated cooling passages, and FIG. 3 a photographic reproduction of an embodiment of a shadow mask in accordance with the invention.

FIG. 1A shows here a (100) silicon wafer 10 with a specific resistance of 0.01 Ohm cm and is polished on both sides. By way of example the wafer 10 of FIG. 1A has a thickness of 500 µm and a width of 100 mm. In plane view (not shown) the silicon wafer is circular in this embodiment with a customary flat at one position.

Figure 1B:
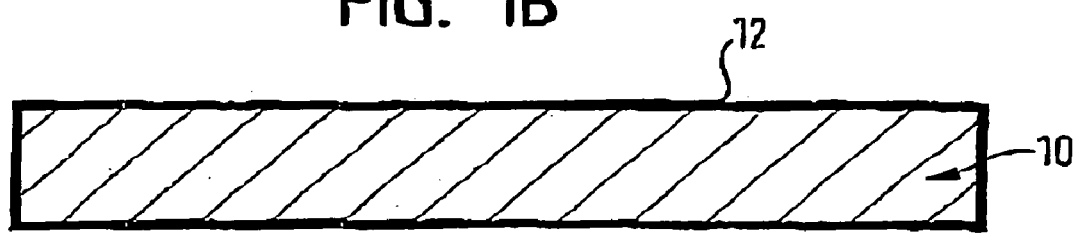

The silicon wafer 10 of FIG. 1A is coated by means of an oxidation step at at least substantially all surfaces with $SiO_2$, so that, for example, a 2 µm thick $SiO_2$ arises, as shown at 12 in FIG. 1B. The thickness of this coating 12 can, for example, straightforwardly lie in the range between 100 nm to 5 µm or more. Such layers can be produced by wet oxidation at 1150° C. Wet signifies here that water is introduced into the treatment chamber.

Figure 1C:
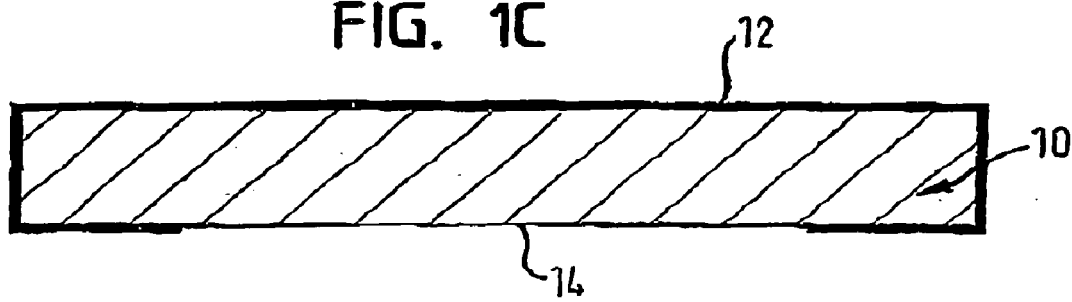
Figure 1D:
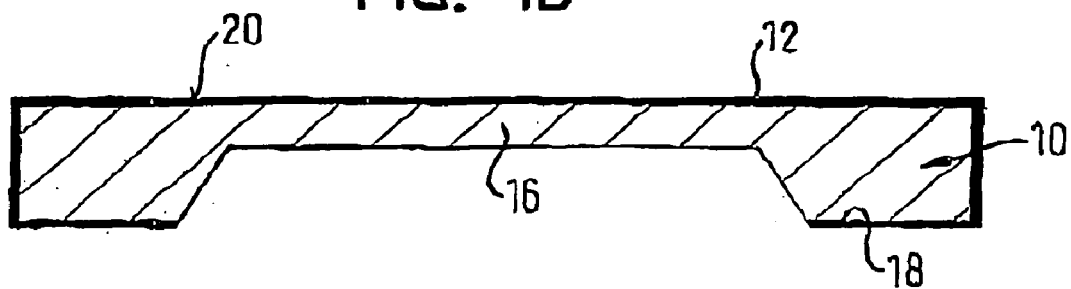

As FIG. 1C shows the $SiO_2$ coating 12 is removed at a part region 14 of the rear side of the wafer. This removal can for example take place by a lithographic process. By immersing the wafer into an alkaline solution it is then etched from the rear side, as shown in FIG. 1D, so that a central region 16 of the wafer arises which is thinner in comparison with the marginal region 18, where the $SiO_2$ coating 12 is still maintained. This region 16 can for example have a thickness of 200 to 300 µm.

Figure 1E:
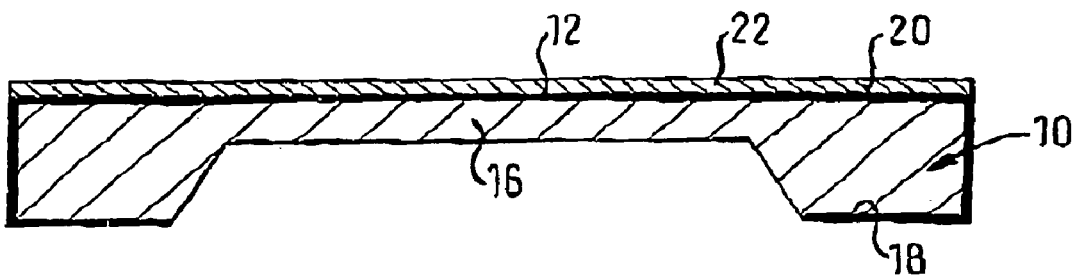

Next of all the front side 20 of the wafer is coated with a resist material 22, as shown in FIG. 1E. This is subsequently exposed and developed in order to provide the resist layer 22 with a pattern by means of lithography which reproduces the shape of the desired holes of the shadow mask.

Figure 1F:
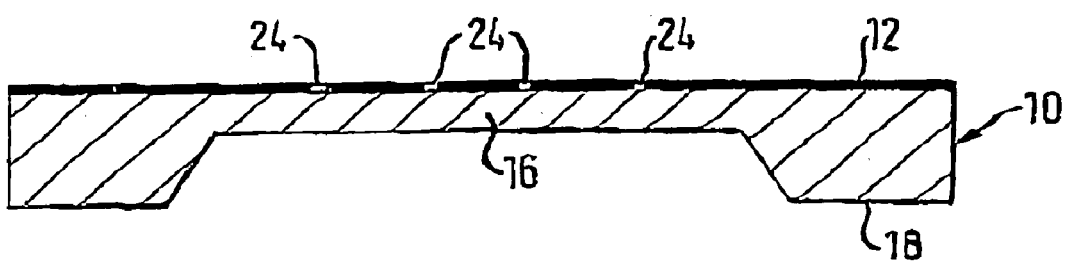
Figure 1G:
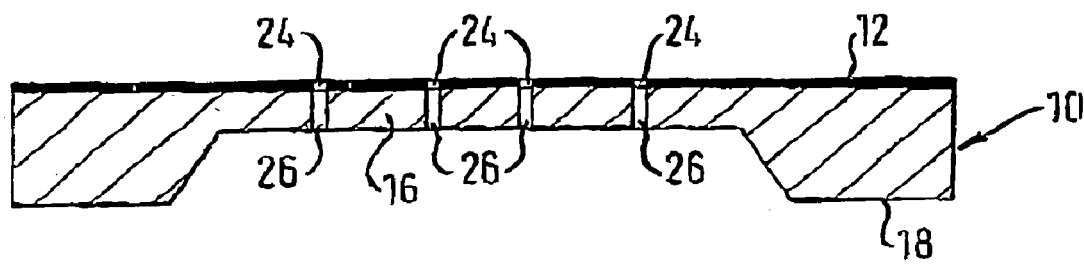

After carrying out an oxide etching process and removal of the resist coating 22 holes 24 are present in accordance with the desired hole pattern in the $SiO_2$ layer 12 in the thinned region 16, as shown in FIG. 1F.

The wafer is now treated by means of an etching process, for example in the form of a dry etching process such as reactive ion etching, sputter etching or etching with alternating gas types (so called gas chopping), in order to produce the hole pattern which is present in the $SiO_2$ layer also in the thinned region 16 of the apertured wafer. The corresponding holes are designated in FIG. 1G by 26.

Figure 1H:
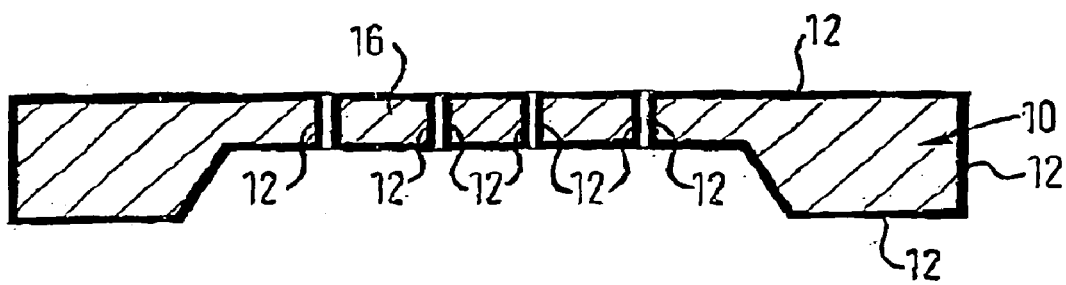

Thereafter the wafer is subsequently oxidized, as shown in FIG. 1H, in order to provide the regions freed of $SiO_2$ in the etching step of FIG. 1F, including the inner walls of the holes 26, with $SiO_2$ 12, i.e. $SiO_2$ is formed on all surfaces of the wafer.

The method step of FIG. 1H can also be carried out by wet oxidation at 1150° C.

Through this method it is ensured, through the insulating $SiO_2$ layer which has arisen in this way, that the surfaces coated with $SiO_2$ 12 are not covered over by galvanically deposited metal during a subsequent galvanic coating step. It is however desired to build up a galvanic metal coating 28 of the front side 20 of the wafer (FIG. 1J) which is why the $SiO_2$ layer 12 is removed from this front side 16 in accordance with FIG. 1I. This can take place by an etching process but also by a mechanical process such as CMP (Chemical Mechanical Polishing) or in other ways.

Figure 1I:
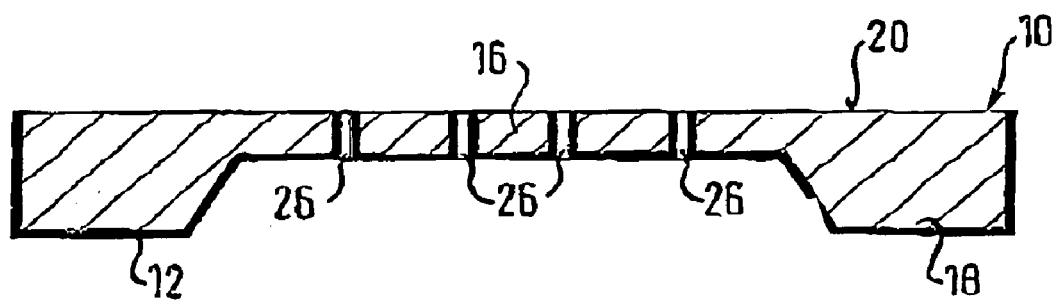
Figure 1J:
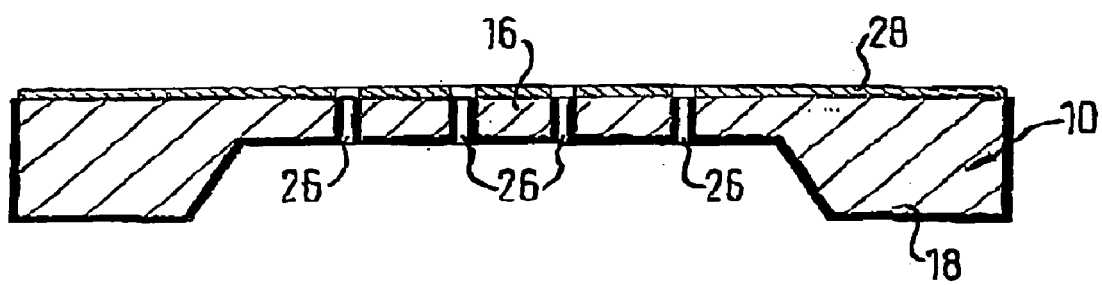

A starting layer, which is not shown in the drawing, is now formed on the exposed front side of the wafer. For example, a starting layer consisting of GeO, Cr or of another metal or of a highly conductive semiconductor layer, such as for example highly conductive silicon, is applied, for example by a sputter treatment, and the wafer is then introduced into a galvanic bath where, after appropriate contacting of the starting layer, the metal layer 28 is applied galvanically to the front side of the silicon wafer with a thickness in the range between 0.5 µm and 20 µm, as is indicated in FIG. 1J. The purpose of this starting layer is to make the surface of the wafer conductive, so that the galvanic process can be carried out.

Figure 1K:
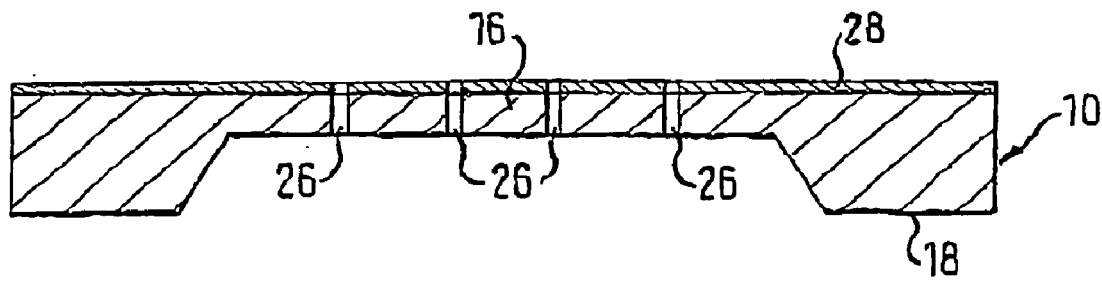

After the formation of the galvanic layer 28 the $SiO_2$ layer 12 is removed at all surface regions by an etching process and the wafer, which now represents the desired shadow mask, is subsequently clean. The reason for the removal of the $SiO_2$ layer 12 in FIG. 1J lies in the fact that the insulating action would otherwise lead to an undesired charging up of the shadow mask on bombardment with ions. The shadow mask is then to be seen as illustrated in FIG. 1K, with the hole pattern 30 for example being formed in similar manner to FIG. 3.

The precise geometrical shape of the hole pattern 30 present in the shadow mask is in principle not of importance, it must be designed in accordance with the envisaged purpose. It is sufficient here to bring out that the above described method and also the modifications of the methods described below make it possible to provide shadow masks with filigrane holes, which can be used for a plurality of purposes. It is in particular possible to provide the holes with length and/or width dimensions which are smaller than 3 µm, whereby correspondingly fine structures can be produced in a substrate which is bombarded with ion beams through the mask.

When the mask is held removed from the surface of the substrate and an ion beam is projected onto the mask, so that a reduced image of the hole pattern is produced on the substrate, whereby very many fine structures can be realized, since it is nowadays straightforwardly possible to operate with size reduction factors of up to 100.

A series of modifications of the just described method are possible. For example the steps of FIGS. 1B, 1C and 1D can be omitted, i.e. it is not essential to treat the wafer in order to provide a thinned central region 12 and a thicker marginal region 18. Instead of this it is entirely possible to dispense with such a thinning operation on choosing suitable dimensions for the apertured wafer, above all a thickness in the range from 300 µm upwardly. The sense of the marginal region 18 is ultimately only to obtain a stable wafer which is easy to handle. If the wafer 10 is made thicker then it is not necessary to thin it at the centre.

When the steps of FIGS. 1B to 1D are omitted then the wafer looks, in the illustration of FIG. 1E approximately as it does in FIG. 1A but with an $SiO_2$ layer at at least the front side, which can for example also be produced by a sputtering process. The further treatment of the wafer then proceeds as shown in FIGS. 1F to 1K.

A further modification with respect to the methodology of FIG. 1 lies in depositing a diamond layer under the surface of the silicon wafer using a methodology known per se. This can for example be carried out directly after the step a) or after the step i) and other possibilities are also conceivable. The diamond layer is for example realized with a thickness in the range between 2 µm and 10 µm and has a very high conductivity. It thus serves for a rapid dissipation of heat from hot regions of the metal layer, i.e. regions where relatively many ions are stopped and ensures that the shadow mask has a uniform low temperature, whereby the working life of the shadow mask can be increased. Another possibility of improving the heat dissipation lies in producing cooling passages in the apertured wafer through which cooling gases, above all helium can be pumped in order to remove heat from the wafer and hereby reduce the temperature of the apertured wafer and increase its working life. As shown in FIG. 2A the cooling passages 30 can be worked into the silicon wafer itself and they are respectively provided with an inlet 32 and an outlet 34 in order to enable the supply and discharge of the cooling gas. One possibility of realizing the cooling passages lies in producing them with a lithographic process. Such cooling passages could for example be produced prior to or after the method step of FIG. 1I. As FIG. 2B shows the cooling passages can have a considerable depth, they can for example have a depth of up to more than 80% of the total thickness of the apertured wafer 16 and they could also vary in depth and/or width and/or length in order to adapt the locally present cooling surface area to the respective circumstances, i.e. the passages can have a larger area at places where heat has to be dissipated, so that the heat transfer from the apertured wafer to the cooling gas is improved.

The open passages 30 shown in FIGS. 2A and 2B must be closed. This takes place best of all in that the apertured wafer is closed by a metal in a tilted position by means of vapour deposition or sputtering. The apertured wafer is rotated in the tilted position and this leads to the openings to the passages being rapidly closed, in particular when the cooling passages are made relatively narrow as shown in FIG. 2C. As soon as the passages have been closed at the top the apertured wafer can be introduced into the galvanic bath in order to grow the desired galvanic coating 28 on the surface of the apertured wafer.

The vapour deposition or sputtering of metals onto the surface of the apertured wafer in order to close cooling passages can namely simultaneously serve to deposit a metallic starting layer for the galvanic coating on the surface of the apertured wafer.

Another possibility of introducing the cooling passages into the apertured wafer lies in lithographically producing the cooling passages already at the stage of FIG. 1A. The apertured wafer can then be introduced before further steps into a sputtering device and treated with a material, for example silicon dioxide or silicone nitrite in a sputtering process, so that the cooling passages are closed from the top. In such a treatment it is necessary to arrange the wafer at an oblique angle and to rotate it. The covering over of the cooling passages can only take place economically with this oblique angle. After the covering over of the cooling passages in this way and means the wafer can be polished by means of CMP. In this way the irregularities produced by the sputtering process are removed, however the polishing process is carried out so that the cover for the cooling passages is not broken through. The method then proceed as previously described in connection with FIG. 1, optionally omitting the method steps of FIGS. 1B, 1C and 1D, until the stage of FIG. 1I is achieved.

It is now necessary to once again close the (now reopened) cooling passages by sputtering. For this purpose the apertured wafer is introduced into a sputtering apparatus and rotated in an oblique position so that the entrances to the cooling passages are closed over with a metallic coating. The surface at the front side of the wafer is also provided with the metallic coating and this then serves as a starting layer for the galvanic coating. It is indeed possible that the holes of the shadow mask which form the actual hole pattern are also closed by this process. This is however not problematic, because it is possible to bombard the holes of the hole pattern with ions from the rear side, whereby the hole pattern can be laid free again. The bombarding of the rear side of the apertured wafer with ions does not have any disadvantageous effect on the cooling passages, since these are closed from below, so that the ions cannot enter into action there. After deposition of the galvanic coating the $SiO_2$ coating can be removed as previously and the shadow mask presents itself in the finished state in accordance with FIG. 1K.

It is also possible to design the cooling passages so that they also extend through any diamond layer that is present. In order to bring this about, the diamond layer can either be deposited onto the surface of the apertured wafer when the cooling passages are already present but have not yet been closed, or the entire surface of the apertured wafer can be provided with a diamond layer and a lithographic process can be used in order to form the cooling passages. For example one can irradiate the diamond layer with an ion beam in order to convert it locally into graphite and this graphite layer can then be easily etched away.

The cooling passages can also be present in the metal layer. It is for example possible to deposit a part of the metal layer, then to produce cooling passages in the metal layer, for example by means of a lithographic method and then to close off the cooling passages and grow a further metal layer by means of a galvanic process on the existing metal layer, in order to finish the metal layer.

The metal layer can also consist of an alternating sequence of different metal layers which have different lattice constants. The lattice constant of the one layer should be smaller than that of silicon whereas the lattice constant of the other layer should be larger than that of silicon so that on average no strain is present. Intermediate layers can be provided at the transition between the silicon wafer and the first metal layer of the alternating layer sequence which achieves a gradual adaptation to the lattice constant of the lowermost metal layer so that on the whole a structure without pronounced strain is present.

The invention claimed is:

1. Shadow mask for ion beams consisting of a silicon wafer with a hole pattern arranged therein, wherein the silicon wafer is provided at the side confronting the incident ion beams with a metallic coating which stops the ion beams and dissipates heat, characterized in that the apertured region of the silicon wafer has a thickness in the range from 20 µm to 200 µm and in that the apertures in the shadow mask have smallest lateral dimensions in the range between 3 µm and 0.5 µm.

2. Shadow mask in accordance with claim 1, characterized in that a diamond layer is located between the metal coating and the silicon wafer.

3. Shadow mask in accordance with claim 2, characterized in that the diamond layer has a thickness between 2 µm and 10 µm.

4. Shadow mask in accordance with one of the preceding claims, characterized in that the silicon wafer has a thicker marginal region in comparison to the apertured region.

5. Shadow mask in accordance with one of the preceding claims, characterized in that the marginal region of the apertured wafer has a thickness in the range between 300 µm and 1000 µm.

6. Shadow mask in accordance with one of the preceding claims, characterized in that the metal coating consists of one or more of the following metals: W, Ti, Au, Mo, Co, Cu, Hf, Al, Ta, Cr, Pt, Ag.

7. Shadow mask in accordance with one of the preceding claims, characterized in that the thickness of the metal coating lies in the range between 0.5 µm and 20 µm.

8. Shadow mask in accordance with one of the preceding claims, characterized in that the metal coating consists of an alternating layer sequence of different metals or compositions with different lattice constants larger and smaller than silicon in order to avoid larger strains.

9. Shadow mask in accordance with one of the preceding claims, characterized in that cooling passages are worked into the silicon wafer and/or into the diamond layer and/or into the metal coating and are covered over by the metal coating.

10. Shadow mask in accordance with claim 9, characterized in that the cooling passages are provided with an inlet and with an outlet which are not are not fully covered over by the coating.

11. Shadow mask in accordance with one of the claims 9 or 10, characterized in that the cooling passages have a width in the range between 100 nm and 10 µm and a depth of up to 80% of the total thickness of the shadow mask.

12. Shadow mask in accordance with one of the preceding claims, characterized in that the wafer has an outer diameter in the range between 5 mm and 300 m or more.

13. Shadow mask in accordance with one of the preceding claims, characterized in that with ion beams with power densities greater than 3 W/cm$^2$ the shadow mask has a durability of over 100 hours.

14. Shadow mask in accordance with one of the preceding claims, characterized in that the walls which bound the holes of the shadow mask at least partly diverge in the direction away from the metal coating.

15. Shadow mask in accordance with one of the preceding claims, characterized in that the metal coating of the shadow mask is provided with an electrical voltage connection.

* * * * *